(12) United States Patent
Tanaka et al.

(10) Patent No.: US 7,404,321 B2
(45) Date of Patent: Jul. 29, 2008

(54) SENSOR DEVICE HAVING A BUFFER ELEMENT BETWEEN THE MOLDING AND THE SENSING ELEMENT

(75) Inventors: Masaaki Tanaka, Kariya (JP); Tsutomu Onoue, Kariya (JP)

(73) Assignee: DENSO CORPORATION, Kariya (JP)

(*) Notice: Subject to any disclaimer, the term of this patent is extended or adjusted under 35 U.S.C. 154(b) by 7 days.

(21) Appl. No.: 11/485,318

(22) Filed: Jul. 13, 2006

(65) Prior Publication Data
US 2007/0022808 A1 Feb. 1, 2007

(30) Foreign Application Priority Data
Jul. 29, 2005 (JP) ............... 2005-221512

(51) Int. Cl.
*G01F 1/68* (2006.01)
(52) U.S. Cl. .................................. 73/204.26
(58) Field of Classification Search ............... 73/204.26
See application file for complete search history.

(56) References Cited

U.S. PATENT DOCUMENTS

| 5,396,795 | A | * | 3/1995 | Araki ...................... 73/204.26 |
| 6,049,120 | A | | 4/2000 | Otani et al. |
| 6,176,131 | B1 | * | 1/2001 | Hecht et al. ............... 73/204.26 |
| 6,666,082 | B2 | * | 12/2003 | Watanabe et al. ......... 73/204.22 |
| 6,789,418 | B2 | | 9/2004 | Uramachi et al. |
| 6,820,479 | B2 | | 11/2004 | Roeckel et al. |
| 7,219,543 | B2 | | 5/2007 | Tanaka et al. |
| 7,219,544 | B2 | * | 5/2007 | Tanaka et al. ............ 73/204.26 |

FOREIGN PATENT DOCUMENTS

| JP | A-11-006752 | 1/1999 |
| JP | A-2001-001373 | 1/2001 |
| JP | A-2001-296197 | 10/2001 |

OTHER PUBLICATIONS

Office Action dated Feb. 21, 2008 in corresponding German Patent Application No. 10 2006 035 000.6-52 (and English translation).

* cited by examiner

*Primary Examiner*—Harshad Patel
(74) *Attorney, Agent, or Firm*—Posz Law Group, PLC

(57) ABSTRACT

A method of manufacturing a sensor device includes a step of forming a sensor chip including a sensing element and a wiring portion connected to the sensing element on a substrate, a step of connecting the wiring portion to a lead, and a step of molding a member for covering a connecting portion between the wiring portion and the lead by injecting a molding material in a mold, while the sensing element is exposed. In the molding step, a buffering member is disposed between an area to be covered with the molded member and the sensing element. Furthermore, in the molding step, the buffering member is deformed by a pressure from the mold, and the molding material is injected in the deformed state of the buffering member so as to form the molded member.

22 Claims, 6 Drawing Sheets

↑ AIR

SENSOR DEVICE HAVING A BUFFER ELEMENT BETWEEN THE MOLDING AND THE SENSING ELEMENT

CROSS REFERENCE TO RELATED APPLICATION

This application is based on Japanese Patent Application No. 2005-221512 filed on Jul. 29, 2005, the disclosure of which is incorporated herein by reference.

BACKGROUND OF THE INVENTION

1. Field of the Invention

The present invention relates to a sensor device, in which a sensing element is exposed and a connecting portion between a wiring portion and a lead is covered with a molded member, and a method for manufacturing the same.

2. Description of Related Arts

U.S. Pat. No. 5,396,795 (corresponding to JP-B2-2784286) discloses a manufacturing method of a sensor device in which a sensing element is exposed and a connecting portion between a wiring portion and a lead is covered with a molded member.

In the method according to the U.S. Pat. No. 5,396,795, firstly a dam resin membrane made of silicon resin is formed around a sensor element portion. Secondly, only a connecting portion between a connecting terminal and a lead is covered with a molded resin, while the sensor element is exposed. The molded resin sandwiches a semiconductor chip through the dam resin membrane so that the dam resin membrane plays a role of a shield. That is, the sensor element portion can be prevented from being contaminated by the molded resin.

Also, Japanese Patent No. 3,328,547 discloses a thermal type flow sensor. In the flow sensor, a flow-detecting chip is mounted to a supporting member. A part of a flow-detecting portion including a heater is exposed to a fluid to be measured. An area including a connecting portion and a circuit chip is covered with a molded member integrally. The connecting portion connects a connecting wire to the flow-detecting portion, a circuit portion, and a lead.

In the above-described thermal type flow sensor, the supporting member includes an end face and both side faces for positioning of the flow-detecting chip. The faces of the supporting member are bent in a vertical direction from a bottom part of the supporting member, in which the flow-detecting chip is disposed. The position of the flow-detecting chip is determined by the end face and the both side faces of the supporting member. The flow-detecting chip is disposed in the supporting member to cover a cavity portion underneath a membrane portion of a substrate. Therefore, the cavity portion underneath the membrane portion of the flow detection chip is covered with the supporting member. Thus, the cavity is not directory exposed to the fluid, i.e., air to be measured. Accordingly, a generation of a turbulent at the cavity portion can be prevented. A temperature fluctuation of the heater can be decreased so that a noise of an output signal can be decreased.

However, according to the manufacturing method of the sensor device shown in U.S. Pat. No. 5,396,795, a burr may be formed in the side faces of the semiconductor chip because the dam resin membrane cannot be provided on the side faces of the semiconductor chip.

For example, if the manufacturing method shown in U.S. Pat. No. 5,396,795 is simply applied to the thermal type flow sensor according to Japanese Patent No. 3,328,547, a burr may be formed in the side faces of the flow-detecting chip, because there is a clearance between the side face of the supporting member and the side face of the flow-detecting chip. The molding material can pass through the clearance at the mold forming time. In this case, if a burr is formed, a turbulent may be generated by the burr. Thus, an accuracy of detection cannot be maintained.

SUMMARY OF THE INVENTION

In view of the foregoing and other problems, it is an object of the present invention to provide a sensor device whose accuracy of detection can be improved, and a method for manufacturing the sensor device.

According to a first aspect of the present invention, a method of manufacturing a sensor device includes a forming process, a connecting process, and a molding process. In the forming process, a sensor chip including a sensing element, and a wiring portion connected to the sensing element are formed on a substrate. In the connecting process, the wiring portion of the sensor chip is connected to a lead. In the molding process, a member for covering a connecting portion between the wiring portion and the lead is molded with the sensing element exposed, by injecting a molding material in a mold. In the molding process, a buffering member is disposed in an area between a boundary of an area to be covered with the molded member and the sensing element. Furthermore, the buffering member is deformed by a pressure from the mold, and the molding material is injected in the deformed state of the buffering member so as to form the molded member.

Accordingly, the buffering member can fill a clearance causing a burr, e.g., clearance between the molded member and the sensor chip. That is, a generation of the burr can be prevented so that the accuracy of the detection can be improved in the sensor device.

According to a second aspect of the present invention, a sensor device includes a substrate, a sensor chip, a supporting member, a lead, a molded member, and a buffering member. The sensor chip includes a sensing element and a wiring portion connected to the sensing element on the substrate. A back surface of the sensor chip is mounted to the supporting member. The lead is connected to the wiring portion electrically. The molded member covers a connecting portion between the wiring portion and the lead, while the sensing element is exposed. The buffering member is deformable by a pressure from an outside, and disposed in an area between the molded member and the sensing element.

According to a third aspect of the present invention, a sensor device includes a substrate, a sensor chip, a supporting member, a lead, a molded member, a sealant member, and a buffering member. The sensor chip includes a sensing element and a wiring portion connected to the sensing element on the substrate. The sensor chip is mounted to the supporting member. The supporting member includes positioning portions to which an end surface and sides surfaces of the sensor chip face, respectively. The lead is connected to the wiring portion electrically. The molded member covers a connecting portion between the wiring portion and the lead, while the sensing element is exposed. The sealant member is disposed in a clearance in a predetermined depth between the surfaces of the sensor chip and the positioning portions in an area between the molded member and the sensing element. The buffering member is deformable by a pressure from an outside, and disposed in an area between a boundary of the sealant member and the molded member, and the sensing element.

According to the second and third aspects, the buffering member can fill a clearance causing a burr, e.g., clearance between the molded member and the sensor chip, or clearance between the sensor chip and the supporting member on which the sensor chip is mounted. That is, a generation of the burr can be prevented so that the accuracy of the detection can be improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

In following embodiments, a thermal type flow sensor is taken for an example as a sensor device.

First Embodiment

Figure 1A:
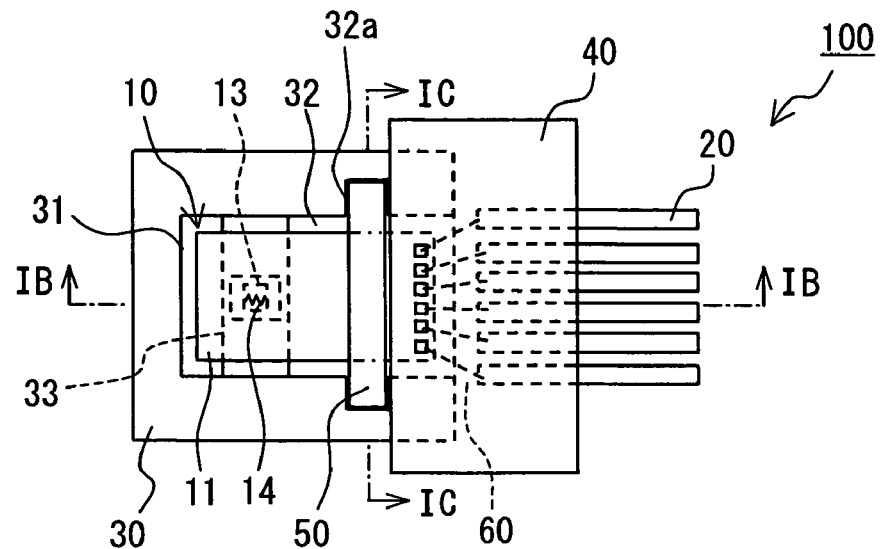
FIG. 1A is a schematic plan view showing a thermal type flow sensor according to a first embodiment of the present invention.
Figure 1B:
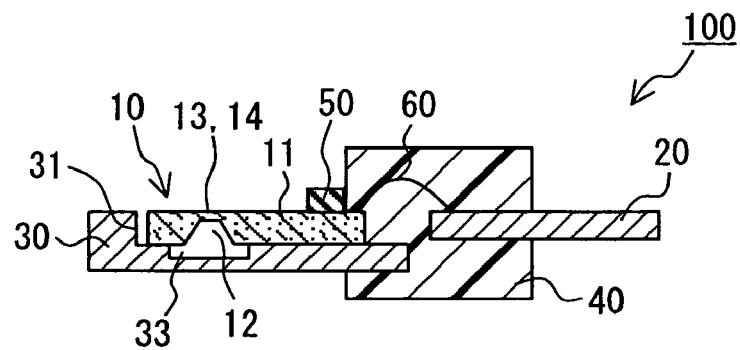
FIG. 1B is a cross-sectional view showing the sensor taken along line IB-IB in FIG. 1A.
Figure 1C:
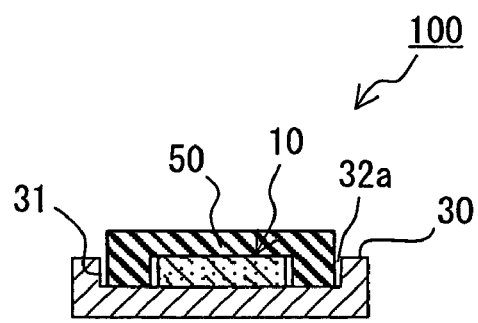
FIG. 1C is a cross-sectional view showing the sensor taken along line IC-IC in FIG. 1A.

As shown in FIGS. 1A, 1B, and 1C, a thermal type flow sensor 100 in a first embodiment includes a flow-detecting chip 10, a lead 20, a supporting member 30, a resin member 40 and a buffering member 50. The flow-detecting chip 10 detects a flow amount of air by exposing a part of the chip 10 to the air to be measured. The lead 20 connects the flow-detecting chip 10 to the outside of the sensor 100 electrically. The flow-detecting chip 10 is mounted to the supporting member 30. The resin member (molded member) 40 is formed by molding and covers a connecting portion between the flow-detecting chip 10 and the lead 20. The resin member 40 may be molded with materials except for resin. The buffering member 50 is deformable by an outside pressure. Further, a bonding wire 60 connects the flow-detecting chip 10 to the lead 20 electrically as shown in FIGS. 1A and 1B. Alternatively, the flow-detecting chip 10 and the lead 20 can be connected not only by the bonding wire 60, but also by a bump, for example.

The flow-detecting chip 10 includes a membrane portion 13 and a heater 14. The membrane portion 13 is an insulating film formed above a cavity 12. The cavity 12 is formed in a semiconductor substrate 11 made of silicon by etching. The heater 14 is formed on the membrane portion 13. Etching from a backside of the semiconductor substrate 11 can form the membrane portion 13 easily. Accordingly, the heaters 14 can function as a highly sensitive flow-detecting portion, as described later.

Figure 2:
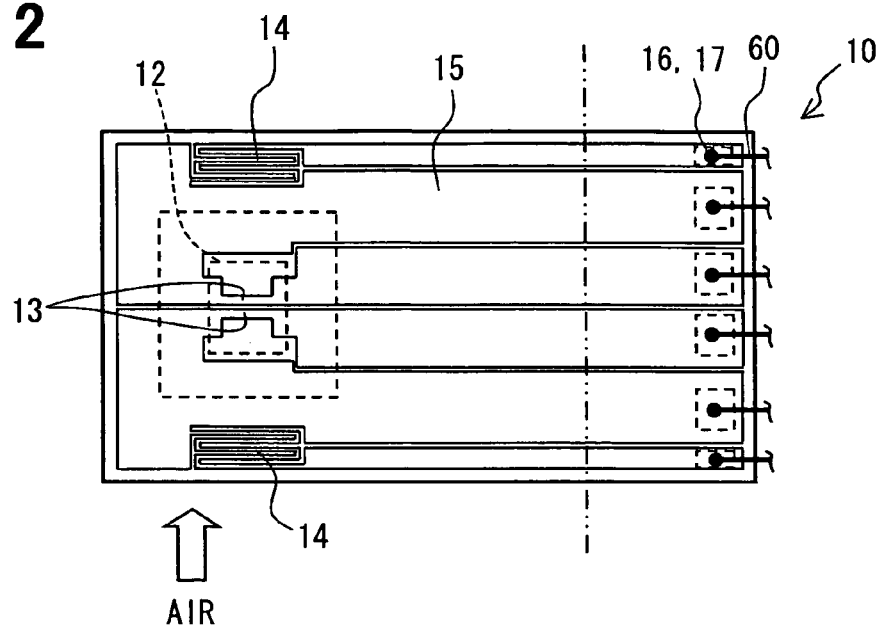
FIG. 2 is a schematic plan view showing a flow-detecting chip according to the first embodiment.

The flow-detecting chip 10 will be described in details with reference to FIG. 2. FIG. 2 is a schematic plan view of the flow-detecting chip 10. In FIG. 2, the resin member 40 is omitted for convenience. The resin member 40 covers a right area of a chain double-dashed line in FIG. 2.

The membrane portion 13 is formed thinly compared with the semiconductor substrate 11. Therefore, a heat capacity of the membrane portion 13 is small. A thermal insulation of the membrane portion 13 from the semiconductor substrate 11 is secured. As shown in FIG. 2, a pair of heaters 14 including heating resistors are provided in the membrane portion 13. A first heater 14 is disposed at the upstream side of an air flow (outline arrow shown in FIG. 2), and a second heater 14 is disposed at the downstream side of the air flow. The heaters 14 correspond to a sensing element in this embodiment. Further, a pair of temperature sensors 15 constructed with resistance temperature sensors are provided on the semiconductor substrate 11 around the membrane portion 13 to be positioned between the heaters 14. A first temperature sensor 15 is disposed at the upstream side of the air flow, and a second temperature sensor 15 is disposed at the downstream side of the air flow.

The heaters 14 have a function of heating elements in accordance with a supplied electric current. In addition, the heaters 14 have another function of sensing elements. The heaters 14 detect its temperature based on a change of its resistance-temperature coefficient. A flow amount of air is detected based on an amount of heat transferred to the air flow from the heat generated by each heater 14. Moreover, an amount of the current supplied to the first heater 14 is controlled based on a temperature difference between the first heater 14 and the first temperature sensor 15. An amount of the current supplied to the second heater 14 is controlled based on a temperature difference between the second heater 14 and the second temperature sensor 15.

A pad 17 in FIG. 2 is an electrode, which is provided at an end of wiring 16. A flow-detecting portion and the lead 20 are connected electrically through the bonding wire 60 connected to the pad 17. The flow-detecting portion includes the heaters 14 formed on the membrane portion 13, the temperature sensors 15, and the wiring 16. A part of the wiring 16 and the pad 17 are covered with the resin member 40. In the first embodiment, the pad 17 of the flow-detecting chip 10 and the lead 20 are connected directly through the bonding wire 60. Alternatively, the pad 17 of the flow-detecting chip 10 and the lead 20 can be connected electrically through a circuit board including a processing circuit.

The flow-detecting chip 10 is mounted to the supporting member 30. In the first embodiment, the supporting member 30 is formed by processing, e.g., etching, the same material as the lead 20. Therefore, the construction of the thermal type flow sensor 100 can be simplified. Further, the cavity 12 of the flow-detecting chip 10 is not directly exposed to air to be measured. Accordingly, a noise due to a turbulent can be reduced, compared with a construction, in which the supporting member 30 is not disposed underneath the cavity 12.

To be specific, as shown in FIGS. 1A and 1B, a groove portion 31 is formed on an end face of the supporting member 30 e.g., by half-etching. The groove portion 31 is larger than the outline of the flow-detecting chip 10 by a clearance. The flow-detecting chip 10 is disposed in the groove portion 31. (The flow-detecting chip 10 is fixed to the bottom of the groove portion 31 by e.g., adhesive, with the backside of the flow-detecting portion down.) Moreover, the top surface of the flow-detecting chip 10, on which the flow-detecting portion is formed, and the top surface of the supporting member 30 are positioned on approximately the same flat surface. Accordingly, an affect of a turbulent generated by a bump between the top surface of the flow-detecting chip 10 and the top surface of the supporting member 30 can be reduced. However, a variation in the height direction may be generated in any way because the flow-detecting chip 10 is fixed to the bottom of the groove portion 31 by adhesive. Thus, a burr may be generated on the top surface of the flow-detecting chip 10, on which the flow-detecting portion is formed.

A communicating portion for communicating the cavity 12 with the outside of the flow-detecting chip 10 is formed in the supporting member 30 such that the flow-detecting portion 10 is disposed in the groove portion 31. The cavity 12 of the flow-detecting chip 10 is not fully closed by the supporting member 30. The cavity 12 communicates with the outside, i.e., air to be measured, of the flow-detecting chip 10 through the communicating portion. Accordingly, the temperature of the cavity 12 can change by accompanying the temperature change around the thermal type flow sensor 100. A measurement deviation by the temperature change in the thermal type flow sensor 100 can be reduced compared with in the construction in which the cavity 12 is closed totally by the supporting member 30.

To be specific, as shown in FIGS. 1A and 1B, the groove portion 31 is formed so that a predetermined clearance is provided between the flow-detecting chip 10 and the supporting member 30. When the flow-detecting chip 10 is disposed in the groove portion 31, a predetermined clearance 32 is formed between the side wall face of the groove portion 31 and the side face of the flow-detecting chip 10. Thus, a burr may be generated on the side face of the flow-detecting chip 10. The outline of the supporting member 30 defining the groove portion 31 corresponds to positioning portions in this embodiment.

In the first embodiment, a communicating groove portion 33 is formed at a lower side of the cavity 12 in FIG. 1B by half-etching. The communicating groove portion 33 communicates with the clearance 32. A communicating portion includes the communicating groove portion 33 and the clearance 32. Thus, the construction of the communicating portion can be simplified. Moreover, air to be measured can enter the cavity 12 through the clearance 32. Therefore, a large amount of the air cannot enter the cavity 12, thereby noise of the turbulent can be decreased.

The number of the communicating portion can be one or plural for the cavity 12. The number, shape and size of the communicating portion can be suitably determined, considering the tendency of the turbulent and the capability of following the ambient temperature change in the cavity 12. In the first embodiment, the communicating groove portion 33 is formed along the air flow. On the two side surfaces of the flow-detecting chip 10, the clearances 32 can be formed.

In the first embodiment, a relatively wide clearance 32*a* is formed in the clearance 32 between the boundary of the molded area and the positions of the membrane 13 and the heaters 14. The buffering member 50 is disposed in the wide clearance 32*a*. The positioning of the buffering member 50 is easy by widening the clearance 32 corresponding to the area in which the buffering member 50 is disposed. The buffering member 50 can be fixed to the supporting member 30 tightly because the area of the buffering member 50 in contact with the supporting member 30 increases. However, the buffering member 50 can be disposed in the clearance 32, not in the wide clearance 32*a*, alternatively.

The resin member 40 is made of an insulating material, e.g., epoxy resin, capable to be molded integrally. The resin member 40 covers the bonding wire 60 and the connecting portion connecting the bonding wire 60 to the flow-detecting chip 10 and/or the lead 20 integrally, in such a manner that: the flow-detecting chip 10 is disposed in the groove portion 31 of the supporting member 30; the cavity 12 communicates with the outside of the flow-detecting chip 10 through the communicating portion; and the buffering member 50 is disposed in the wide clearance 32*a* between the flow-detecting chip 10 and the groove portion 31.

A pressure from the outside (e.g., a mold for forming the resin member 40) deforms the buffering member 50. Therefore, the buffering member 50 is formed to fill a clearance causing a burr (e.g., clearance between the mold and the flow-detecting chip 10, clearance between the flow-detecting chip 10 and the supporting member 30). The buffering member 50 capable to be deformed elastically by the pressure from the mold and having a resistance to a pressure from an injection of the resin material for molding is preferable, for example. The buffering member 50 made of the material having above described features can accurately shield the resin material. In the first embodiment, fluorocarbon rubber having a better chemical resistance is used for the buffering member 50, considering the possibility that the buffering member 50 is exposed to an acidic. environment.

The buffering member 50 is disposed in order to fill a clearance causing a burr. The buffering member 50 is disposed in an area between the boundary of the molded area and the positions of the membrane 13 and the heaters 14. In the first embodiment, burrs may be generated on the top surface, on which the flow-detecting portion is formed, and the side surfaces (clearance 32) of the flow-detecting chip 10 as described above. That is, the buffering member 50 is needed to be disposed on the top surface of the flow-detecting chip 10, on which the flow-detecting portion is formed, and the side surfaces of the flow-detecting chip 10.

Therefore, the buffering member 50 is formed into approximately a "U"-letter shape shown in FIG. 1C. The buffering member 50 is disposed at a position equal to or more than 3 mm apart from the end (on the side of the resin member 40) of the membrane portion 13 so that a turbulent cannot be generated by the buffering member 50. The buffering member 50 and the wide clearance 32a corresponding to the buffering member 50 are provided in the predetermined area from the boundary of the molded area to the flow-detecting portion. Both ends of the buffering member 50 in contact with the supporting member 30 are fixed to the supporting member 30.

Next, a manufacturing method of the thermal type flow sensor 100 will be described in FIGS. 3A, 3B, 3C, 4A, and 4B.

Figure 3A:
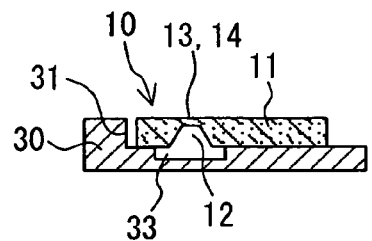
FIG. 3A is a cross-sectional view in a mounting process.

Firstly, the flow-detecting chip 10 and the supporting member 30 are prepared. As shown in FIG. 3A, the position of the flow-detecting chip 10 in the groove portion 31 of the supporting member 30 is determined. The flow-detecting chip 10 is located in the groove portion 31 of the supporting member 30. At this time, the top surface of the flow-detecting chip 10, on which the flow-detecting portion is formed, and the top surface of the supporting member 30 are positioned approximately on the same flat surface. In this state, the predetermined clearance 32 (including the wide clearance 32a) is formed between the flow-detecting chip 10 and the side surface of the groove portion 31. Accordingly, the flow-detecting chip 10 is mounted to a predetermined position of the supporting member 30 in a mounting process.

Figure 3B:
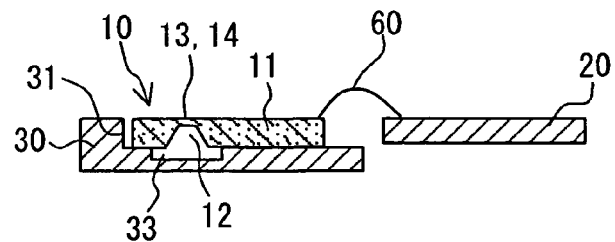
FIG. 3B is a cross-sectional view in a connecting process.

Then, the pad 17 (shown in FIG. 2) of the flow-detecting chip 10 and the lead 20 are connected electrically by the bonding wire 60 as shown in FIG. 3B, in a connecting process.

Figure 3C:
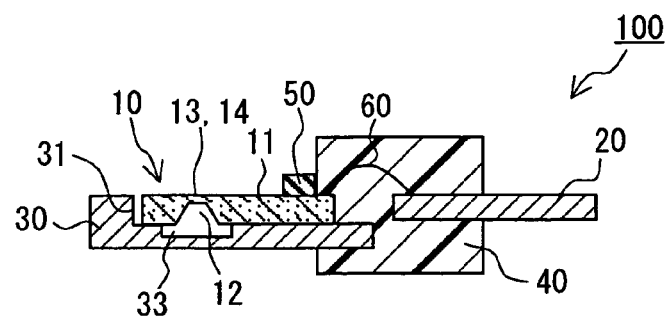
FIG. 3C is a cross-sectional view in a molding process showing a manufacturing method according to the first embodiment.

Next, as shown in FIG. 3C, the buffering member 50 is disposed on the flow-detecting chip 10. The buffering member 50 is disposed at the predetermined position in the area from the boundary of the molded area to the membrane portion 13 and the heaters 14. The bonding wire 60 and the connecting portions connecting the bonding wire 60 to the flow-detecting chip 10 and the lead 20 are covered with the resin member 40 formed by molding using a predetermined mold.

Figure 4A:
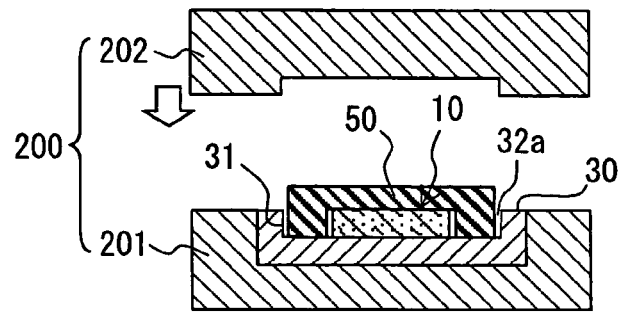
FIG. 4A is a cross-sectional view before a mold fastening.

More specifically, the flow-detecting chip 10 is mounted to the supporting member 30; the lead 20 is connected to the flow-detecting chip 10; and the two ends of the buffering member 50 shaped like a "U"-letter are fixed to the supporting member 30. Afterward, this assembly is disposed in a bottom mold 201 of a mold 200 with the backside of the flow-detecting chip 10 down. This assembly before the mold fastening is shown in FIG. 4A. An external pressure is not pressed on the buffering member 50 so that at least a part of the wide clearance 32a is not filled.

Figure 4B:
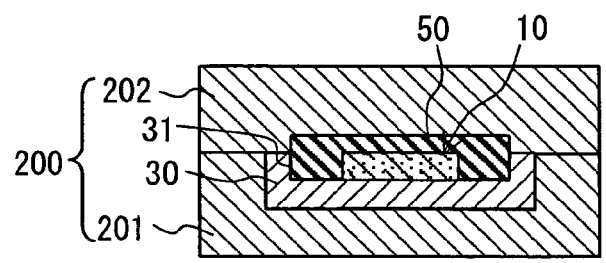
FIG. 4B is a cross-sectional view at the mold fastening time showing an effect of a buffering member according to the first embodiment.

A top mold 202, which is a counterpart of the bottom mold 201, is moved down so that the top mold 202 and the bottom mold 201 are fastened. In the state of the fastening, the pressure from the top mold 202 deforms the buffering member 50 sandwiched by the top mold 202, the bottom mold 201, the flow-detecting chip 10, and the supporting member 30. As shown in FIG. 4B, clearances causing burrs among the top mold 202, the bottom mold 201, the flow-detecting chip 10, and the supporting member 30 are filled. Accordingly, the buffering member 50 shields the flow-detecting portion from the resin member 40 when the material for forming the resin member 40 is injected to a space provided between the bottom mold 201 and the top mold 202 through a gate (not shown). Thus, a penetration of the material for forming the resin member 40 into the flow-detecting portion is prevented.

In addition, in the first embodiment, the lead 20 and the supporting member 30 are made of the same material and integrated by an external frame (not shown) in above described processes. The integration can improve an accuracy of positioning the lead 20, the supporting member 30, and the flow-detecting chip 10. Further, the connecting process and the molding process can be simplified. The external frame is removed after the cure of the injected material for the resin member 40. Thus, the thermal type flow sensor 100 is formed.

According to the thermal type flow sensor 100 and the manufacturing method of the sensor 100 in the first embodiment, the buffering member 50 is disposed in an area between the boundary of the molded area and the position of the membrane 13 and the heaters 14. Afterward, the buffering member 50 is fastened, and the material for molding the resin member 40 is injected. Therefore, at the fastening time, the pressure from the top mold 202 deforms the buffering member 50. The clearance (e.g., between the flow-detecting chip 10 and the top mold 202, or the supporting member 30) causing burrs can be filled surely. That is, the generation of burrs can be prevented so that the accuracy of the detection can be improved.

The accuracy of the detection of the thermal type flow sensor 100 decreases, especially when burrs are generated on the surface of the flow-detecting chip 10 on which the heaters 14 are mounted. In addition, if burrs are generated on the top surface of the flow-detecting chip 10, on which the heaters 14 are mounted, and the side surfaces of the flow-detecting chip 10, a turbulent is generated by the burrs. Thus, a noise caused by the turbulent becomes large. Accordingly, the sensor 100 including the buffering member 50 is effective.

The buffering member 50 is disposed on the flow-detecting chip 10 and the supporting member 30 in the molding process in the first embodiment. Alternatively, the buffering member 50 can be disposed before the molding process (e.g., mounting process or connecting process).

The thermal type flow sensor 100 includes the buffering member 50 in the first embodiment. The buffering member 50 is disposed between the resin member 40 and the flow-detecting portion exposed to an environment to be detected. Therefore, a corrosion proof effect at the connecting portions between the wiring 16 (pad 17) and the lead 20 can be enhanced. However, the thermal type flow sensor 100 may not include the buffering member 50. For example, the buffering member 50 may be disposed in the wide clearance 32a without being fixed to the flow-detecting chip 10 and the supporting member 30. The buffering member 50 can be removed after the molding process. In this manufacturing method, the generation of burrs can be prevented and the accuracy of the detection can be improved. In addition, the buffering member 50 can be used repeatedly so that the cost of the buffering member 50 can be decreased.

The communicating groove portion 33 communicating with the clearance 32 is formed in the lower side of the cavity 12 in FIG. 3B by half-etching in the first embodiment. The communicating portion includes the communicating groove portion 33 and the clearance 32. The ambient temperature of the cavity 12 can change by accompanying the temperature change around the thermal type flow sensor 100. However, the construction of the flow-detecting chip 10 and the supporting member 30 is not limited to the above description. The communicating portion may not be included.

Figure 5A:
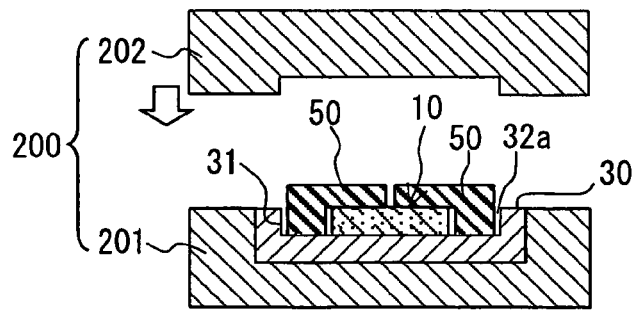
FIG. 5A is a cross-sectional view before a mold fastening.
Figure 5B:
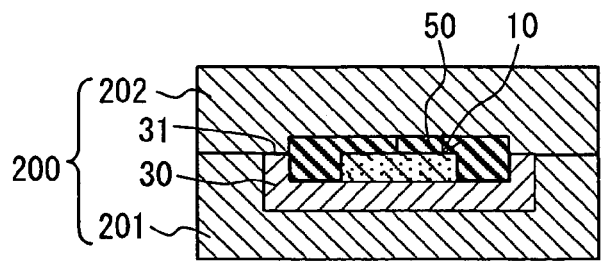
FIG. 5B is a cross-sectional view at the mold fastening time showing an example of a deformation of the buffering member according to the first embodiment.

The buffering member 50 consists of one member in the first embodiment. Alternatively, the buffering member 50 may consist of plural members as shown in FIG. 5A. As shown in FIG. 5B, the clearances causing burrs are completely filled with the plural members at the fastening time. However, the buffering member 50, which consists of one member, is simple and easy for the positioning as described in the first embodiment.

Second Embodiment

A thermal type flow sensor 100 and a manufacturing method of the sensor 100 in the second embodiment have common parts which are in common with those in the first embodiment. Therefore, a detailed description of the common parts will be omitted. A description will be concentrated heavily on different parts.

A different point of the second embodiment from the first embodiment is that the clearances causing burrs are filled with a sealant member 51 together with the buffering member 50. In the second embodiment, the other parts may be made similar to the first embodiment.

Figure 6:
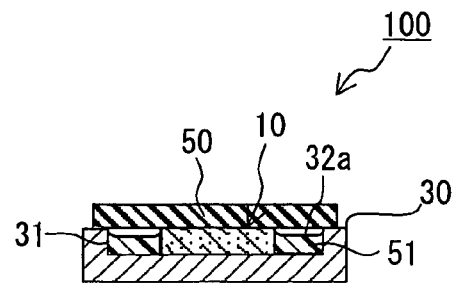
FIG. 6 is a cross-sectional view showing a thermal type flow sensor according to a second embodiment of the present invention.

All the clearances causing burrs are filled with the buffering member 50 only in the first embodiment. Alternatively, after a part of the clearances is filled with other members, the rest of the clearances are filled with the buffering member 50. As shown in FIG. 6, in a thermal type flow sensor 100 according to the second embodiment, the sealant member 51 fills the clearance 32 (e.g., wide clearance 32a) between the side face of the flow-detecting chip 10 and the supporting member 30 in a predetermined depth. The buffering member 50 is disposed on the sealant member 51 and the flow-detecting chip 10.

A material for forming the sealant member 51 can be injected to the clearance 32 (e.g., wide clearance 32a). After the injection, the injected material becomes hardened so as to form the sealant member 51. The sealant member 51 prevents the material for molding the resin member 40 from penetrating the clearance 32 when the material is injected. In the second embodiment, an epoxy adhesive is used for the sealant member 51, for example. The adhesive is effective not only for preventing the material from penetrating the clearance 32 but also for fixing the flow-detecting chip 10 to the supporting member 30.

The buffering member 50 is fixed to the surface of the flow-detecting chip 10, on which the heaters 14 are fixed. Further, the buffering member 50 is fixed to the supporting member 30, which crosses over the groove portion 31.

Figure 7A:
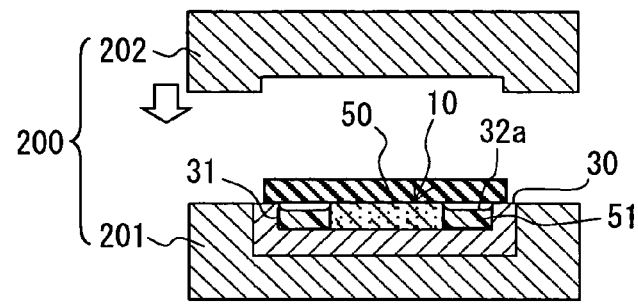
FIG. 7A is a cross-sectional view before a mold fastening.

In the sensor 100 including the sealant member 51 in addition to the buffering member 50, a part of the clearance 32 (e.g., wide clearance 32a) is filled with the liquid material for molding the sealant member 51 in the molding process, as shown in FIG. 7A. After the material for the sealant member 51 becomes hardened, the buffering member 50 is disposed on the sealant member 51 and the flow-detecting chip 10.

Figure 7B:
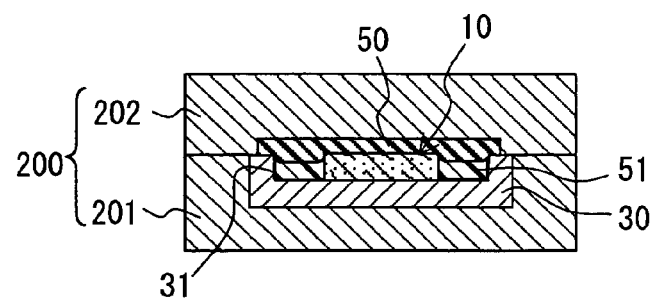
FIG. 7B is a cross-sectional view at the mold fastening time showing the molding process according to the second embodiment.

Next, as shown in FIG. 7B, the assembly is fastened with the top mold 202 and the bottom mold 201. At this time, the pressure from the top mold 202 deforms the buffering member 50. Thus, the clearance, which is not filled with the material for the sealant member 51, is filled with the buffering member 50. Thereafter, the material for the resin member 40 is injected to the space of the mold 200.

Accordingly, the generation of burrs is prevented by the manufacturing method of the thermal type flow sensor 100 according to the second embodiment, thereby the accuracy of the detection can be improved. Especially in a case that the buffering member 50 is difficult to be disposed in the clearance 32, the manufacturing method according to the second embodiment is effective.

The sealant member 51 is formed in the wide clearance 32a in the molding process. Alternatively, the sealant member 51 may be formed and disposed before the molding process. Also, the buffering member 50 may be disposed before the molding process, provided the sealant member 51 is formed.

The thermal type flow sensor 100 includes the buffering member 50 in the second embodiment. However, the thermal type flow sensor 100 may not include the buffering member 50. For example, the buffering member 50 is disposed in the wide clearance 32a without being fixed to the flow-detecting chip 10 and the supporting member 30. The buffering member 50 can be removed after the molding process. In this manufacturing method, the generation of burrs can be prevented and the accuracy of the detection can be improved. In addition, the buffering member 50 can be used repeatedly so that the cost of the buffering member 50 can be decreased.

Third Embodiment

A thermal type flow sensor 100 and a manufacturing method of the sensor 100 in the third embodiment have common parts which are in common with those in the first and second embodiments. Therefore, a detailed description of the common parts will be omitted. A description will be concentrated heavily on different parts.

A different point of the third embodiment from the first and second embodiments is the shape of the supporting member 30.

Figure 8:
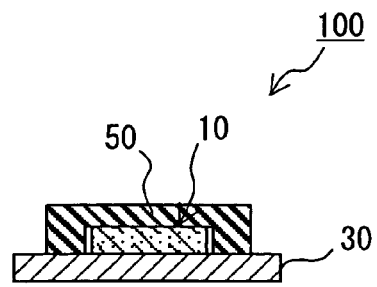
FIG. 8 is a cross-sectional view showing a thermal type flow sensor according to a third embodiment of the present invention.

As shown in FIG. 8, the thermal type flow sensor 100 according to the third embodiment does not include the groove portion 31 in the supporting member 30. In the third embodiment, the other parts may be made similar to the first and second embodiments.

Figure 9A:
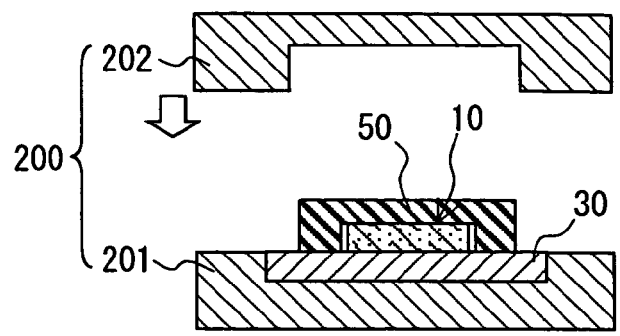
FIG. 9A is a cross-sectional view before a mold fastening.
Figure 9B:
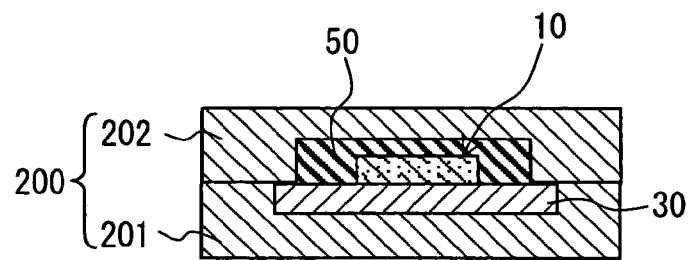
FIG. 9B is a cross-sectional view at the mold fastening time showing a molding process according to the third embodiment.

A predetermined clearance between the top mold 202 and the flow-detecting chip 10 is formed, considering the variations of the mounting position and the height of the flow-detecting chip 10 on the supporting member 30. That is, the predetermined clearance is provided between the mold 200 and the flow-detecting chip 10. As shown in FIG. 9A, the top mold 202 is fastened with the buffering member 50 disposed on the supporting member 30. Accordingly, as shown in FIG. 9B, the pressure from the top mold 202 deforms the buffering member 50. The above-described clearance causing burrs can be filled.

The buffering member 50 may be fixed to the flow-detecting chip 10 and/or the supporting member 30. Also, the buffering member 50 may not be fixed and may be removed after the molding process. The thermal type flow sensor 100 shown in FIG. 8 is fixed to the supporting member 30.

Fourth Embodiment

A thermal type flow sensor 100 and a manufacturing method of the sensor 100 in the fourth embodiment have common parts which are in common with those in the first, second, and third embodiments. Therefore, a detailed description of the common parts will be omitted. A description will be concentrated heavily on different parts.

A different point of the fourth embodiment from the first, second, and third embodiments is that the supporting member 30 is not provided in the construction.

Figure 10A:
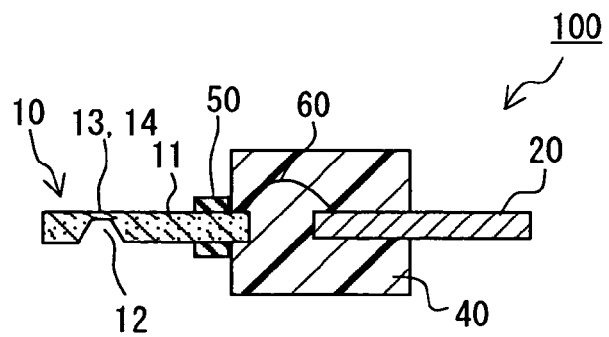
FIG. 10A is a cross-sectional view showing a thermal type flow sensor according to a fourth embodiment of the present invention.
Figure 10B:
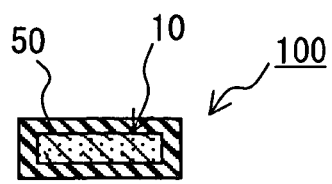
FIG. 10B is a cross-sectional view showing the thermal type flow sensor according to the fourth embodiment of the present invention.

As shown in FIGS. 10A and 10B, in the thermal type flow sensor 100 according to the fourth embodiment, the flow-detecting chip 10 is not fixed to the supporting member 30. In the fourth embodiment, the other parts may be made similar to the first and second embodiments.

Figure 11A:
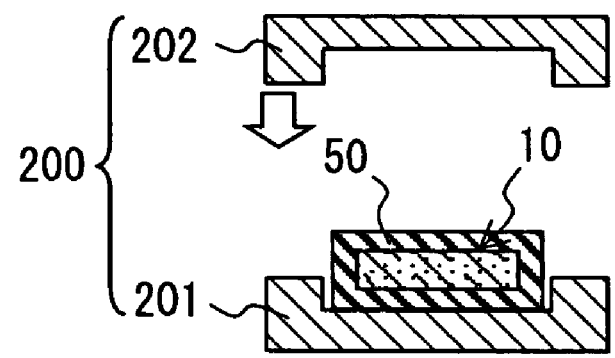
FIG. 11A is a cross-sectional view before a mold fastening.
Figure 11B:
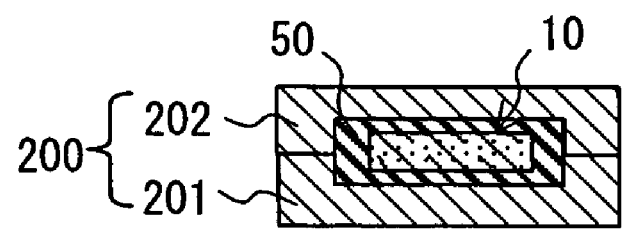
FIG. 11B is a cross-sectional view at the mold fastening time showing a molding process according to the fourth embodiment.

A predetermined clearance between the top mold 202 and the flow-detecting chip 10 is provided. As shown in FIG. 11A, the top mold 202 and the bottom mold 201 are fastened with the buffering member 50 disposed in the bottom mold 201. Accordingly, as shown in FIG. 11B, the buffering member 50 is deformed by the pressure from the top mold 202, and the above-described clearance causing burrs can be filled.

The buffering member 50 may be fixed to the flow-detecting chip 10. Also, the buffering member 50 may not be fixed and may be removed after the molding process. In the thermal type flow sensor 100 shown in FIGS. 10A and 10B, the buffering member 50 is a ring shape having an inserting hole. The flow-detecting chip 10 is inserted to the inserting hole and the buffering member 50 is pressed and fixed.

Although the present invention has been fully described in connection with the preferred embodiments thereof with the reference to the accompanying drawings, it is to be noted that various changes and modifications will become apparent to those skilled in the art.

For example, in the above-described embodiments of the present invention, the flow-detecting chip 10 includes the semiconductor substrate 11 made of silicon. The cavity 12 and the membrane portion 13 can be formed easily on the substrate 11 made of silicon by a general method for manufacturing semiconductors. Accordingly, the thermal type flow sensor 100 can be manufactured at low cost. However, a glass substrate may be used for the semiconductor substrate 11.

Figure 12:
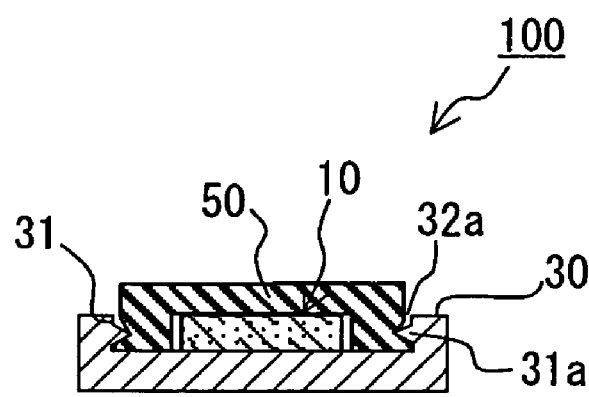
FIG. 12 is a cross-sectional view showing a thermal type flow sensor according to a modified embodiment of the present invention.

In the first, second, and third embodiments, the buffering member 50 is bonded to the flow-detecting chip 10 or the supporting member 30 using an adhesive. In the fourth embodiment, the buffering member 50 is pressed and fitted. However, the method for fixing the buffering member 50 is not limited. For example, in the position of the flow-detecting chip 10 or the supporting member 30 in contact with the buffering member 50, a convex portion or a concave portion can be provided. In this case, the buffering member 50 deformed by the pressure of the top mold 202 is fixed to the convex portion or the concave portion. In the thermal type flow sensor 100 shown in FIG. 12, the convex portions 31a are provided on the side faces of the groove portion 31. In this case, the buffering member 50 is formed to be fitted into the convex portions 31a.

In the above-described embodiments of the present invention, the thermal type flow sensor 100 and the manufacturing method of the sensor 100 are described. However, an applicable scope of the present invention (manufacturing method and device) is not limited to the thermal type flow sensor 100. The present invention can be applied to sensor devices, in which a sensing element is exposed to a medium and a connecting portion between a wiring portion and a lead is covered with a molded member. Except for the thermal type flow sensor 100, the present invention is applied to sensors, e.g., thermopile infrared sensor, humidity sensor, and pressure sensor, especially, in which a part of a sensing element is formed on a membrane portion of a substrate.

Such changes and modifications are to be understood as being within the scope of the present invention as defined by the appended claims.

What is claimed is:

1. A sensor device, comprising:
   a substrate;
   a sensor chip including a sensing element and a wiring portion connected to the sensing element on the substrate;
   a supporting member to which a back surface of the sensor chip is mounted;
   a lead connected to the wiring portion electrically;
   a molded member which covers a connecting portion between the wiring portion and the lead, while the sensing element is exposed; and
   a buffering member which is deformable by a pressure from an outside, wherein the buffering member is disposed in an area between the molded member and the sensing element; wherein
   the buffering member is a U-shaped buffering member having an approximately U-shaped cross section with a closed portion and two end portions extending from the closed portion at its ends; and
   the closed portion of the U-shaped buffering member is positioned on the sensor chip and the two end portions thereof contact the supporting member.

2. The device according to claim 1, wherein:
   the supporting member includes positioning portions to which an end surface and sides surfaces of the sensor chip face, respectively; and
   the buffering member is disposed in a clearance between the surfaces of the sensor chip and the positioning portions of the supporting member.

3. The device according to claim 2, wherein:
   the sensor chip is disposed in the supporting member to form plural clearances with the positioning portions;
   the clearance, in which the buffering member is disposed, is wider than the other clearance.

4. The device according to claim 1, wherein:
   at least one of the sensor chip and the supporting member has a convex or a concave provided in contact with the buffering member.

5. The device according to claim 1, wherein:
   the buffering member is fixed to the supporting member or the sensor chip.

6. The device according to claim 1, wherein:
   the molded member is molded using a mold by injecting a molding material in the mold;
   the buffering member is deformable elastically by a pressure from the mold; and
   the buffering member has a resistance to a pressure of the injection of the molding material.

7. The device according to claim 6, wherein:
   the buffering member is made of a rubber.

8. The device according to claim 1, wherein:
   the supporting member is made of the same material as the lead.

9. The device according to claim 1, wherein:
   the substrate has a membrane portion;
   at least a pan of the sensing element is located on the membrane portion; and
   the molded member covers the connecting portions between the wiring portion and the lead while the sensing element and the membrane portion are exposed from the molded member.

10. The device according to claim 1, wherein:
    the sensor chip is a flow detecting chip in which a flow detecting portion including a heater is located on the membrane portion.

11. A sensor device, comprising:
    a substrate;
    a sensor chip including a sensing clement and a wiring portion connected to the sensing element on the substrate;

a supporting member to which the sensor chip is mounted, wherein the supporting member includes positioning portions to which an end surface and side surfaces of the sensor chip face;

a lead connected to the wiring portion electrically;

a molded member which covers a connecting portion between the wiring portion and the lead, while the sensing element is exposed;

a sealant member which is disposed in a clearance with a predetermined depth, the clearance being defined by the side surface of the sensor chip and the positioning portion of the supporting member, and the clearance being positioned in an area between the molded member and the sensing element; and a buffering member which is deformable by a pressure from an outside, wherein the buffering member is disposed in an area between a boundary of the sealant member and the molded member, and the sensing element.

12. The device according to claim 11, wherein:
the sealant member is an adhesive.

13. The device according to claim 11, wherein:
the sensor chip is disposed in the supporting member to form plural clearances with the positioning portions;
the clearance, in which the buffering member is disposed, is wider than the other clearance.

14. The device according to claim 11, wherein:
at least one of the sensor chip and the supporting member has a convex or a concave provided in contact with the buffering member.

15. The device according to claim 11, wherein:
the buffering member is fixed to the supporting member or the sensor chip.

16. The device according to claim 11, wherein:
the molded member is molded using a mold by injecting a molding material in the mold;
the buffering member is deformable elastically by a pressure from the mold; and
the buffering member has a resistance to a pressure of the injection of the molding material.

17. The device according to 16, wherein:
the buffering member is made of a rubber.

18. The device according to claim 11, wherein:
the supporting member is made of the same material as the lead.

19. The device according to claim 11, wherein:
the substrate has a membrane portion;
at least a part of the sensing element is located on the membrane portion; and
the molded member covers the connecting portions between die wiring portion and the lead while the sensing element and the membrane portion are exposed from that molded member.

20. The device according to claim 11, wherein:
the sensor chip is a flow detecting chip in which a flow detecting portion including a heater is located on the membrane portion.

21. The device according to claim 11, wherein:
the buffer member is disposed over and is adhered to the sealant member.

22. The device according to claim 11, wherein:
the sealant members are separately disposed on opposing sides of the sensor chip and are adhered to the sensor chip and to the buffering member, which is disposed over the sealant members.

* * * * *